US008854136B2

(12) United States Patent
Cavallaro et al.

(10) Patent No.: US 8,854,136 B2
(45) Date of Patent: Oct. 7, 2014

(54) FULLY DIFFERENTIAL OPERATIONAL AMPLIFIER WITH COMMON-MODE FEEDBACK CIRCUIT

(71) Applicants: STMicroelectronics (Grenoble 2) SAS, Grenoble (FR); STMicroelectronics S.r.l., Agrate Brianza (IT)

(72) Inventors: Marco Orazio Cavallaro, Catania (IT); Serge Ramet, Jarrie (FR); Tiziano Chiarillo, Tremestieri Etnea (IT)

(73) Assignees: STMicroelectronics (Grenoble 2) SAS, Grenoble (FR); STMicroelectronics S.r.l., Agrate Brianza (MB) (IT)

( * ) Notice: Subject to any disclaimer, the term of this patent is extended or adjusted under 35 U.S.C. 154(b) by 14 days.

(21) Appl. No.: 13/677,496

(22) Filed: Nov. 15, 2012

(65) Prior Publication Data
US 2013/0127536 A1 May 23, 2013

(30) Foreign Application Priority Data
Nov. 18, 2011 (IT) .............................. MI2011A2100

(51) Int. Cl.
*H03F 3/45* (2006.01)
(52) U.S. Cl.
CPC .............. *H03F 3/45* (2013.01); *H03F 3/45183* (2013.01); *H03F 3/45659* (2013.01)
USPC ......................................... 330/260; 330/258

(58) Field of Classification Search
CPC ............ H03F 3/45183; H03F 3/45071; H03F 3/45083; H03F 3/45702; H03F 3/45659; H03F 3/45085; H03F 3/45479; H03F 3/45475; H03F 1/3211; H03F 1/34; H03F 2203/45424
USPC .................................................. 330/252–261
See application file for complete search history.

(56) References Cited

U.S. PATENT DOCUMENTS

| | | | |
|---|---|---|---|
| 7,129,782 B2 * | 10/2006 | Lebedev et al. ................ | 330/258 |
| 7,180,369 B1 | 2/2007 | Cui et al. | |
| 8,319,554 B1 * | 11/2012 | Das ............................ | 330/258 |
| 2002/0024384 A1 | 2/2002 | Fattaruso et al. | |
| 2002/0075073 A1 | 6/2002 | Muza | |
| 2007/0188231 A1 | 8/2007 | Gupta et al. | |
| 2008/0157873 A1 | 7/2008 | Yokoyama et al. | |
| 2009/0108934 A1 | 4/2009 | Forejt | |

OTHER PUBLICATIONS

Italian Search Report and Written Opinion for IT MI2011A002100 mailed Sep. 5, 2012 (7 pages).

* cited by examiner

*Primary Examiner* — Hieu Nguyen
(74) *Attorney, Agent, or Firm* — Gardere Wynne Sewell LLP

(57) ABSTRACT

A fully differential operational amplifier includes a differential input stage, at least one output stage and a common-mode feedback circuit connected with the input stage. The differential input stage includes a differential pair of transistors and a bias circuit for the differential pair of transistors. A start-up circuit operates to detect an operating condition of the differential pair of transistors of the input stage and in response thereto turn on the bias circuit.

23 Claims, 2 Drawing Sheets

US 8,854,136 B2

FULLY DIFFERENTIAL OPERATIONAL AMPLIFIER WITH COMMON-MODE FEEDBACK CIRCUIT

PRIORITY CLAIM

This application claims priority from Italian Application for Patent No. MI2011A002100 filed Nov. 18, 2011, the disclosure of which is hereby incorporated by reference.

TECHNICAL FIELD

The present invention relates to a fully differential operational amplifier with common-mode feedback circuit.

BACKGROUND

The design of high-accuracy analog circuits is becoming a difficult task with the scaling down of supply voltages and transistor channel lengths of the current mixed-signal integrated circuits. Different circuits require the use of a high performance active cell as the operational amplifier (OpAmp). Furthermore, some low-IF transceivers use a complex filter requiring an operational amplifier with a very high gain-bandwidth product in order to have enough loop gain at the higher band limit and low power circuits impose a reduction in the current in order to increase the battery life-time in mobile handsets.

Unfortunately, the bandwidth depends on the technology and the current used in the OpAmp output stage and hence the only way to reduce the current consumption is to reduce the complexity/consumption of the circuits around the OpAmp such as bias, common mode feed-back, start-up circuit.

A good solution to the above requirements is represented by the fully-differential topology OpAmp; in fact the fully-differential topology guarantees a high level of common-mode noise and spur-harmonics rejection. However, these operational amplifier topologies still require a common-mode circuit which represents an additional source of current consumption; in some cases an undesired bias condition can be verified for reducing this current consumption.

SUMMARY

In view of the state of the art, there is a need to provide a fully differential operational amplifier with common-mode feedback circuit which, by means of a start-up circuit, allows a deep reduction of the current consumption of the operational amplifier.

In an embodiment, a fully differential operational amplifier comprises a differential input stage, at least one output stage and a common-mode feedback circuit connected with the input stage, the differential input stage comprising a differential pair of transistors and a bias circuit of said differential pair of transistors, characterized by comprising a start-up circuit configured to detect the operating condition of the differential pair of transistors of the input stage and configured to turn on said bias circuit when the operating condition of said differential pair of transistors has been detected.

BRIEF DESCRIPTION OF THE DRAWINGS

The features and advantages of the present invention will become apparent from the following detailed description of an embodiment thereof, illustrated only by way of non-limitative example in the annexed drawings, in which.

DETAILED DESCRIPTION OF THE DRAWINGS

Figure 1:
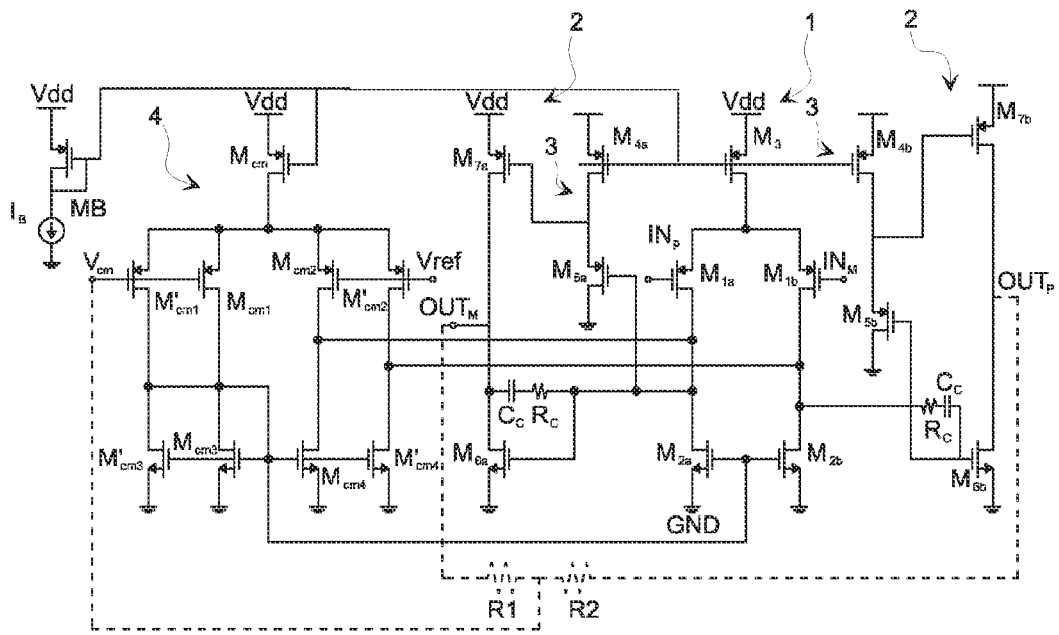
FIG. 1 is a scheme of a fully differential operational amplifier with common-mode feedback circuit according to prior art.

A fully differential operational amplifier with common-mode feedback circuit is shown in FIG. 1. The circuit comprises an input stage 1 comprising a differential pair of PMOS transistors $M_{1a}$, $M_{1b}$ having a differential input signal at the input terminals $IN_P$, $IN_M$. The drain terminals of the transistors $M_{1a}$, $M_{1b}$ of the differential pair are connected to the output terminals $OUT_P$, $OUT_M$ by means of a series of a capacitor C and a resistance $R_c$. The output terminals $OUT_P$, $OUT_M$ belong to two output stages 2, each output stage comprising a couple of PMOS transistors $M_{7b}$, $M_{7b}$ and NMOS transistors $M_{6a}$, $M_{6b}$ having the drain terminal in common and connected to the output terminals $OUT_P$, $OUT_M$ and the two level shifters 3 connected between the output terminals of the differential pair and the gate terminals of the PMOS transistors $M_{7a}$, $M_{7b}$ and NMOS transistors $M_{6a}$, $M_{6b}$ of the couples.

NMOS transistors $M_{2a}$, $M_{2b}$ have their gate terminals in common, the source terminals connected to ground, and the drain terminals connected to the drain terminals of the differential pair transistors. The biasing of the differential pair is performed by means of a PMOS transistor $M_3$ having the source terminal connected to the supply voltage Vdd and the drain terminal connected with the source terminals in common of the differential pair and by means of the transistors NMOS $M_{2a}$, $M_{2b}$; the transistor $M_3$ mirrors a bias current $I_B$, deriving from a generator $I_B$, by means of the mirror connection with a transistor MB connected with the generator $I_B$. The gate terminal of the transistor $M_3$ is connected with the gate and drain terminals of the transistor MB having the drain terminal connected to the current generator $I_B$.

The two level shifters 3 of the output stages are implemented by means of a couple a PMOS transistors and NMOS transistors arranged in series $M_{4a}$, $M_{5a}$ and $M_{4b}$, $M_{5b}$ and connected between the supply voltage Vdd and ground GND. The gate terminals of the transistors $M_{5a}$, $M_{5b}$ are connected to the output terminals of the differential pair while the gate terminals of the transistors $M_{4a}$, $M_{4b}$ are connected to the gate terminal of the transistor MB and the source terminals are connected with the supply voltage Vdd.

The operational amplifier comprises a common-mode feedback circuit 4 connected between the output terminals of the differential pair and preferably with the gate terminal in common of the transistors NMOS $M_{2a}$, $M_{2b}$.

The common-mode feedback circuit 4 comprises a first differential pair $M_{cm1}$, $M_{cm2}$ and a second differential pair $M'_{cm1}$, $M'_{cm2}$ having the source terminals in common and the respective drain terminals connected to the couple of NMOS transistors $M_{cm3}$, $M_{cm4}$ and $M'_{cm3}$, $M'_{cm4}$ having the source terminals connected to ground and the gate terminals in common and connected with the drain terminals of the transistors $M_{cm3}$, $M'_{cm3}$ and with the gate terminals in common of the transistors NMOS $M_{2a}$, $M_{2b}$. The gate terminals of the transistors $M'_{cm1}$, $M_{cm1}$ are connected with the common mode voltage Vcm and the gate terminals of the transistors M'$_{cm2}$, M$_{cm2}$ are connected with the reference voltage Vref. The biasing of the common-mode feedback circuit 4 is performed by means of a PMOS transistor M$_{cm}$ having the source terminal connected to the supply voltage Vdd, the gate terminal connected with the gate terminal of the transistor MB and the drain terminal connected with the source terminals of the transistors M$_{cm1}$, M$_{cm2}$ and M'$_{cm1}$, M'$_{cm2}$.

The common-mode feedback circuit 4 is a current mode feedback circuit. The feedback currents allow to compensate the small difference between the current flowing through M$_{1a}$, M$_{2a}$ and M$_{1b}$, M$_{2b}$ and force the output voltage to Vref, that is the first differential pair M$_{cm1}$, M$_{cm2}$ and the second differential pair M'$_{cm1}$, M'$_{cm2}$ are adapted to make the common mode voltage Vcm equal to the reference voltage Vref by varying the current flowing through the input stage 1.

The common mode voltage Vcm may be determined by means of a series of high value resistances R1 and R2 which is connected between the output terminals OUT$_P$, OUT$_M$ and the connection of the terminal at which the common mode voltage Vcm is present with the common terminal of the resistances R1 and R2.

The circuit in FIG. 1 shows problems in low power consumption configuration; a reduction of the current of the operational amplifier comports an increasing of the gain and a reduction of the stability which can become unacceptable.

The removing of the electric connection between the gate terminals of the transistors M$_{cm3}$, and M$_{cm4}$ and M'$_{cm3}$, M'$_{cm4}$ and the gate terminals of the transistors M$_{2a}$, M$_{2b}$ produces an incorrect operation of the operation amplifier; in fact, when the current of the operation amplifier is lower than a prefixed threshold, the amplifier is latched in an undesired DC bias condition. That is, the current of the common-mode feedback circuit 4 is not enough to force the voltages at the output terminals of the input stage 1 to the correct value and the operational amplifier does not work.

Figure 2:
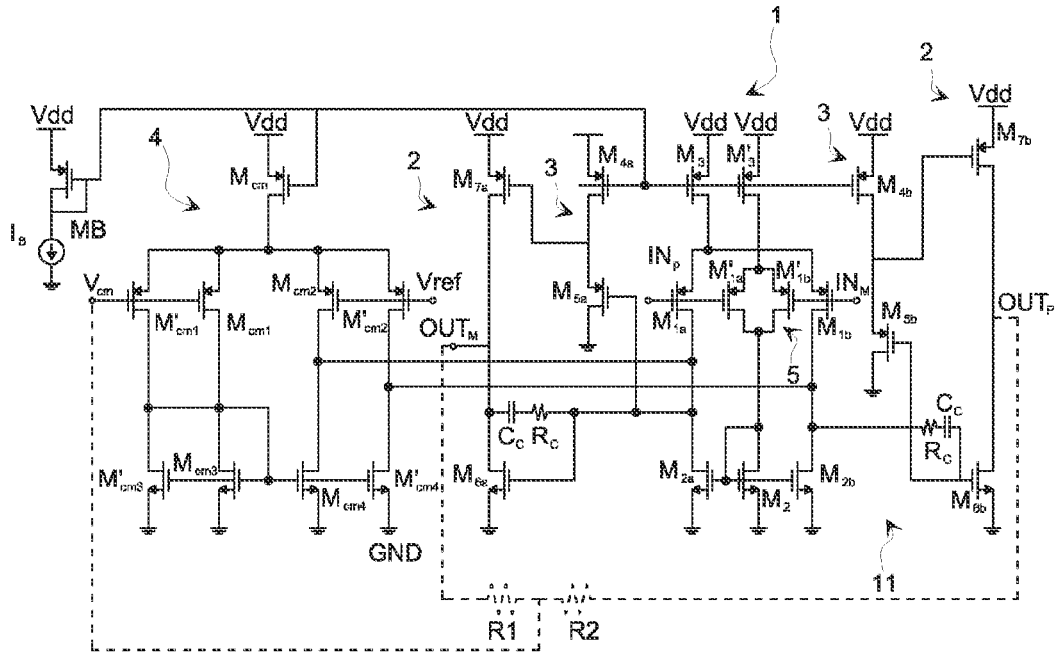
FIG. 2 is a scheme of a fully differential amplifier with common-mode feedback circuit.

FIG. 2 shows a fully differential operational amplifier with common-mode feedback circuit. The fully differential amplifier comprises an input stage 1 comprising at least one differential pair of PMOS transistors M$_{1a}$, M$_{1b}$ having a differential input signal at the input terminals IN$_P$, IN$_M$. The drain terminals of the transistors M$_{1a}$, M$_{1b}$ of the differential pair are connected to the output terminals OUT$_P$, OUT$_M$ by means of the series of a capacitor C$_c$ and a resistance R$_c$. The output terminals OUT$_P$, OUT$_M$ belong to two output stages 2, each output stage comprising preferably a couple of PMOS transistors M$_{7a}$, M$_{7b}$ and NMOS transistors M$_{6a}$, M$_{6b}$ having the drain terminal in common and connected to the output terminals OUT$_P$, OUT$_M$.

The operational amplifier comprises a bias circuit 11 comprising the NMOS transistors M$_{2a}$, M$_{2b}$ having the gate terminals in common, the source terminals connected to ground and the drain terminals connected to the drain terminals of the differential pair transistors. The biasing of the differential pair is performed by means of a PMOS transistor M$_3$ having the source terminal connected to the supply voltage Vdd and the drain terminal connected with the source terminals in common of the differential pair and by means of the bias circuit 11 comprising the transistors NMOS M$_{2a}$, M$_{2b}$; the transistor M$_3$ mirrors a bias current I$_B$, deriving from a generator I$_B$, by means of the mirror connection with a transistor MB connected with the generator I$_B$. The gate terminal of the transistor M$_3$ is connected with the gate and drain terminals of the transistor MB having the drain terminal connected to the current generator I$_B$.

Preferably the operational amplifier comprises two level shifters 2 connected between the output terminals of the differential pair and the gate terminals of the transistors M$_{7a}$, M$_{7b}$ and M$_{6a}$, M$_{6b}$ of the couples.

The two level shifters 3 of the output stages are implemented by means of a couple a PMOS transistors and NMOS transistors arranged in series M$_{4a}$, M$_{5a}$ and M$_{4b}$, M$_{5b}$ and connected between the supply voltage Vdd and ground GND. The gate terminals of the transistors M$_{5a}$, M$_{5b}$ are connected to the output terminals of the differential pair while the gate terminals of the transistors M$_{4a}$, M$_4$b are connected to the gate terminal of the transistor MB and the source terminals are connected with the supply voltage Vdd.

The operational amplifier comprises a common-mode feedback circuit 4 connected between the output terminals of the differential pair of the input stage 1.

The common-mode feedback circuit 4 comprises a first differential pair M$_{cm1}$, M$_{cm2}$ and a second differential pair M'$_{cm1}$, M'$_{cm2}$ having the source terminals in common and the respective drain terminals connected to the couples of NMOS transistors M$_{cm3}$, M$_{cm4}$ and M'$_{cm3}$, M'$_{cm4}$ having the source terminals connected to ground and the gate terminals in common and connected with the drain terminals of the transistors M$_{cm3}$, M'$_{cm3}$. The gate terminals of the transistors M'$_{cm1}$, M$_{cm1}$ are connected with the common mode voltage Vcm and the gate terminals of the transistors M'$_{cm2}$, M$_{cm2}$ are connected with the reference voltage Vref. The biasing of the common-mode feedback circuit 4 is performed by means of a PMOS transistor M having the source terminal connected to the supply voltage Vdd, the gate terminal connected with the gate terminal of the transistor MB and the drain terminal connected with the source terminals of the transistors M$_{cm1}$, M$_{cm2}$ and M'$_{cm1}$, M'$_{cm2}$.

The common-mode feedback circuit 4 is a current mode feedback circuit. The feedback currents allow to compensate the small difference between the current flowing through M$_{1a}$, M$_{2a}$ and M$_{1b}$. M$_{2b}$ and force the output voltage to Vref, that is the first differential pair M$_{cm1}$, M$_{cm2}$ and the second differential pair M'$_{cm1}$, M'$_{cm2}$ are adapted to make the common mode voltage Vern equal to the reference voltage Vref by varying the current flowing through the input stage 1.

The operational amplifier comprises a start-up circuit 5 configured to detect the operating condition of differential pair of the input stage 1 of the operational amplifier and configured to turn on the bias circuit 11 of the input stage 1 only when the differential pair has reached said operating condition.

The start-up circuit 5 comprises a pair of MOS transistors M'$_{1a}$, M'$_{1b}$ having the source and drain terminals in common and the gate terminals respectively connected with the transistors M$_{1a}$, M$_{1b}$ and a MOS transistor M$_2$ having the gate and drain terminal in common and connected with the drain terminals of the transistors M'$_{1a}$, M'$_{1b}$, the gate terminal connected with the gate terminal of the transistors M$_{2a}$, M$_{2b}$ and the source terminal connected to ground GND. The transistors M'$_{1a}$, M'$_{1b}$ and M$_2$ are a replica of the transistors M$_{1a}$, M$_{1b}$ and M$_{2a}$ or M$_{2b}$ respectively; the term "replica" is used herein to refer a copy or duplicate of an original, which may be of different scale to the original. Preferably the transistors M'$_{1a}$, M'$_{1b}$ and M$_2$ are a scaled version of the transistors M$_{1a}$, M$_{1b}$ and M$_{2a}$ or M$_{2b}$ respectively. The operational amplifier in FIG. 2 comprises another PMOS transistor M'$_3$ having the source terminal connected with the supply voltage Vdd, the gate connected with the gate terminal of the transistor MB and drain terminal connected with the source terminals of the transistors M'$_{1a}$, M'$_{1b}$; PMOS transistor M'$_3$ provides to bias the start-up circuit 5 by a bias current which is a replica of the bias current used to bias the input stage 1, particularly the differential pair of transistors of the input stage 1.

The pair of transistors M'$_{1a}$, M'$_{1b}$ allows detecting the bias condition of the operational amplifier in FIG. 2. If the transistors M$_{1a}$, M$_{1b}$ of the differential pair of the input stage 1 are turned on, the start-up circuit 5 allows the turning on of the bias circuit comprising the transistors M$_{2a}$ and M$_{2b}$. Preferably the transistors M'$_{1a}$, M'$_{1b}$ are structured (in terms of size and current flowing therein) so that the gate-source voltages of the transistors M'$_{1a}$, M'$_{1b}$ must be equal to the respective gate-source voltages of the transistors M$_{1a}$, M$_{1b}$.

The common mode voltage Vcm may be determined by means of a series of high value resistances R1 and R2 which is connected between the output terminals OUT$_P$, OUT$_M$ and the connection of the terminal at which the common mode voltage Vcm is present with the common terminal of the resistances R1 and R2.

Figure 3:
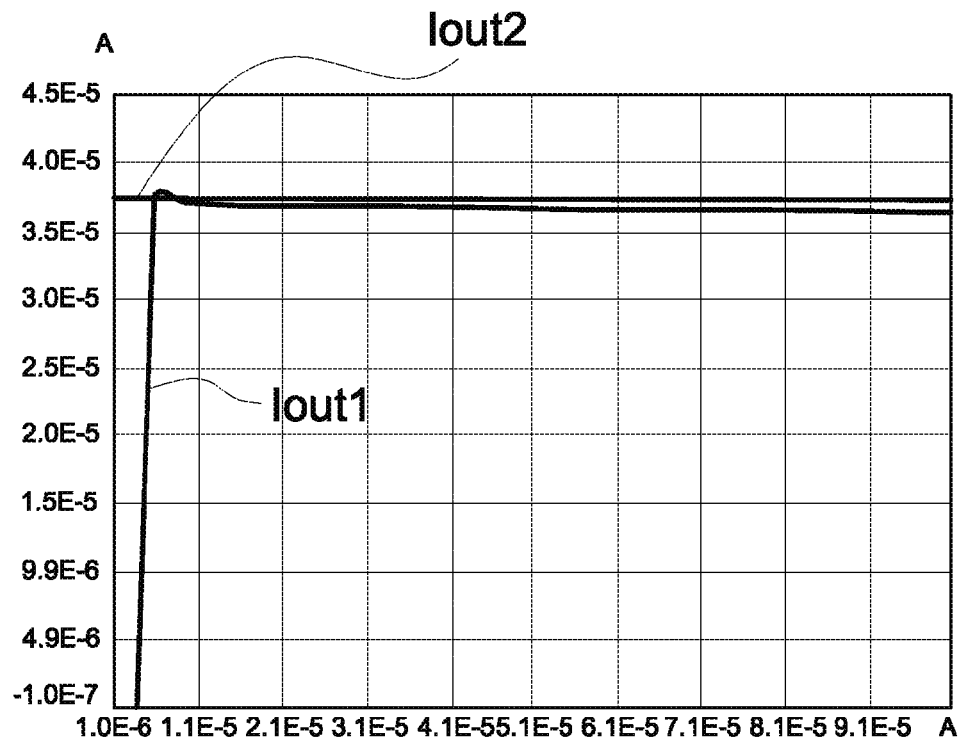
FIG. 3 shows a diagram of the output currents of the operational amplifiers in FIGS. 1 and 2 versus the current flowing in the common-mode feedback circuit.
Figure 4:
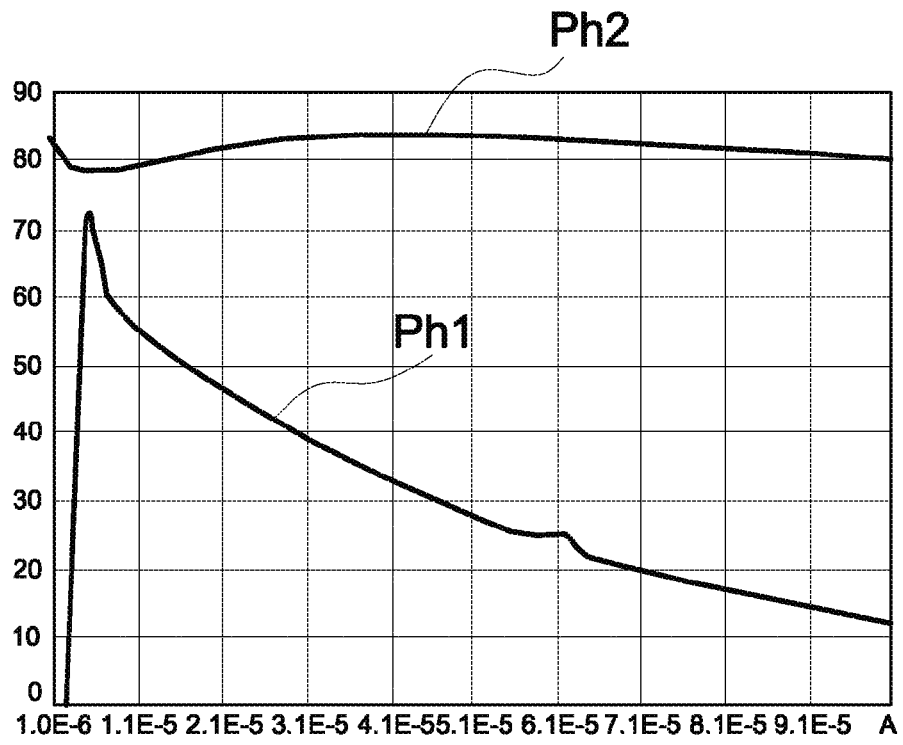
FIG. 4 shows a diagram of the phase margins of the operational amplifiers in FIGS. 1 and 2 versus the current flowing in the common-mode feedback circuit.

FIGS. 3 and 4 show a comparison between the circuit in FIG. 1 (according to the prior art) and the circuit in FIG. 2 (according to the invention) with respect the value of the current I_cm flowing through the common-mode feed-back circuit. FIG. 3 shows the waveform of the output currents Iout1 and Iout2, generated on a capacitive load from the operational amplifier circuits in FIGS. 1 and 2, versus the current I_cm flowing through the common-mode feed-back circuit; the comparison between the currents Iout1 and Iout2 discloses that a minimum current around 10 u is required by the operational amplifier circuit in FIG. 1 to turn on. Furthermore, if the current I_cm decreases, due to the process spread, the operational amplifier circuit in FIG. 1 does not operate.

FIG. 4 shows the phase-margins Ph1 and Ph2 of the operational amplifiers in FIGS. 1 and 2 versus the current I_cm; it is shown that if the operational amplifier circuit in FIG. 1 requires a more current to operate, the phase margin Ph1 fall-down very fast. Differently, the operational amplifier circuit in FIG. 2 may operate even with very low current I_cm. Furthermore the operational amplifier circuit in FIG. 2 exhibits a very stable output current and phase-margin value.

What is claimed is:

1. A fully differential operational amplifier, comprising:
   a differential input stage comprising a first differential pair of transistors and a bias circuit for said differential pair of transistors, and
   a start-up circuit comprising an additional differential pair of transistors having input terminals coupled to the respective input terminals of the first differential pair of transistors for the input stage and being a replica of the first differential pair of transistors, wherein said additional differential pair of transistors is configured to detect an operating condition of the first differential pair of transistors of the differential input stage and turn on said bias circuit when the operating condition of said first differential pair of transistors has been detected.

2. The fully differential operational amplifier according to claim 1, further comprising:
   at least one output stage coupled to an output of the differential input stage, and
   a common-mode feedback circuit coupled to the differential input stage.

3. The fully differential operational amplifier according to claim 2, wherein said differential input stage comprises at least two input terminals and at least one output terminal, said output terminal coupled to the at least one output stage and with the common-mode feedback circuit, said common-mode feedback circuit comprising at least two second differential pairs of transistors.

4. The fully differential operational amplifier according to claim 1, wherein said bias circuit comprises at least a first transistor pair coupled to the first differential pair of transistors for the input stage so as to allow a current path between output terminals of the first differential pair of transistors and a reference voltage, said start-up circuit being adapted to turn on said first transistor pair of the bias circuit.

5. The fully differential operational amplifier according to claim 4, wherein said start-up circuit comprises a diode connected MOS transistor having the gate and drain terminals in common and the source terminal coupled to a reference voltage, said first transistor pair of the bias circuit comprising MOS transistors with drain terminals coupled to output terminals of the additional differential pair of transistors of the start-up circuit, with gate terminals in common and coupled to the gate terminal of the diode connected MOS transistor and source terminals coupled to said reference voltage.

6. The fully differential operational amplifier according to claim 4, further comprising a circuit adapted to bias said start-up circuit by means of a bias current which is a replica of a bias current of the first differential pair of transistors of the input stage.

7. A circuit, comprising:
   a first differential pair of transistors having gate terminals coupled to receive differential input signals, a first common terminal coupled to first and second conduction terminals of the first differential pair of transistors and differential outputs coupled to third and fourth conduction terminals of the first differential pair of transistors;
   a second differential pair of transistors having gate terminals also coupled to receive the differential input signals, a second common terminal coupled to first and second conduction terminals of the second differential pair of transistors and a third common terminal coupled to third and fourth conduction terminals of the first differential pair of transistors;
   a first current source transistor coupled between a first reference node and the first common terminal;
   a second current source transistor coupled between the first reference node and the second common terminal;
   a current mirror circuit having a first leg coupled between the third conduction terminal of the first differential pair of transistors and a second reference node, a second leg coupled between the third common terminal and the second reference node, and a third leg coupled between the fourth conduction terminal of the first differential pair of transistors and the second reference node.

8. The circuit of claim 7, wherein the current mirror circuit comprises a control node coupled to the third common terminal.

9. The circuit of claim 7, wherein the current mirror circuit comprises:
   a first mirror transistor having a first gate terminal, a first conduction terminal coupled to the third conduction terminal of the first differential pair of transistors and a second conduction terminal coupled to the second reference node;
   a second mirror transistor having a second gate terminal, a third conduction terminal coupled to the third common terminal and a fourth conduction terminal coupled to the second reference node; and
   a third mirror transistor having a third gate terminal, a fifth conduction terminal coupled to the fourth conduction terminal of the first differential pair of transistors and a sixth conduction terminal coupled to the second reference node.

10. The circuit of claim 9, wherein the first, second and third gate terminals are coupled to each other.

11. The circuit of claim 10, wherein the first, second and third gate terminals are further coupled to the third common terminal.

12. The circuit of claim 7, wherein the current mirror circuit functions as a selectively actuatable bias circuit for the first differential pair of transistors, and said second differential pair of transistors functions as a startup circuit operable to selectively actuate the bias circuit formed by the current mirror circuit in response to detecting an operating condition of the first differential pair of transistors.

13. The circuit of claim 7, further comprising:
an output stage coupled to the differential outputs at the third and fourth conduction terminals of the first differential pair of transistors; and
a common-mode feedback circuit coupled between outputs of the output stage and one of the third and fourth conduction terminals of the first differential pair of transistors.

14. The circuit of claim 7, wherein the second differential pair of transistors is a replica of the first differential pair of transistors.

15. A circuit, comprising:
a differential input stage comprising:
a first differential pair of transistors having gate terminals coupled to receive differential input signals, said first differential pair having a first common terminal coupled to first and second conduction terminals of the first differential pair of transistors and differential outputs coupled to third and fourth conduction terminals of the first differential pair of transistors; and
a biasing circuit including a control node and comprising a first leg coupled between the third conduction terminal of the first differential pair of transistors and a reference node and a second leg coupled between the fourth conduction terminal of the first differential pair of transistors and the reference node; and
a start-up circuit, comprising:
a second differential pair of transistors having gate terminals also coupled to receive the differential input signals, said second differential pair having a second common terminal coupled to first and second conduction terminals of the second differential pair of transistors and a third common terminal coupled to third and fourth conduction terminals of the first differential pair of transistors; and
a mirror transistor having a first conduction terminal coupled to the third common terminal, a second conduction terminal coupled to the reference node, and a gate terminal coupled to the third common terminal and to the control node of the biasing circuit.

16. The circuit of claim 15, further comprising:
a first current source transistor coupled between a first reference node and the first common terminal; and
a second current source transistor coupled between the first reference node and the second common terminal.

17. The circuit of claim 16, further comprising an additional biasing circuit coupled to gate terminals of the first and second current source transistors.

18. The circuit of claim 15, further comprising:
an output stage coupled to the differential outputs at the third and fourth conduction terminals of the first differential pair of transistors; and
a common-mode feedback circuit coupled between outputs of the output stage and one of the third and fourth conduction terminals of the first differential pair of transistors.

19. The circuit of claim 15, wherein the second differential pair of transistors is a replica of the first differential pair of transistors.

20. A fully differential operational amplifier, comprising:
a differential input stage comprising a first differential pair of transistors and a bias circuit for said differential pair of transistors,
a start-up circuit configured to detect an operating condition of the first differential pair of transistors of the differential input stage and turn on said bias circuit when the operating condition of said first differential pair of transistors has been detected,
at least one output stage coupled to an output of the differential input stage, and
a common-mode feedback circuit coupled to the differential input stage,
wherein said start-up circuit comprises an additional differential pair of transistors having input terminals coupled to the respective input terminals of the first differential pair of transistors for the input stage and being a replica of the first differential pair of transistors, said additional differential pair of transistors of the start-up circuit configured to detect the operating condition of the first differential pair of transistors of the input stage.

21. The fully differential operational amplifier according to claim 20, wherein said bias circuit comprises at least a first transistor pair coupled to the first differential pair of transistors for the input stage so as to allow a current path between output terminals of the first differential pair of transistors and a reference voltage, said start-up circuit being adapted to turn on said first transistor pair of the bias circuit.

22. The fully differential operational amplifier according to claim 21, wherein said start-up circuit comprises a diode connected MOS transistor having the gate and drain terminals in common and the source terminal coupled to a reference voltage, said first transistor pair of the bias circuit comprising MOS transistors with drain terminals coupled to output terminals of the additional differential pair of transistors of the start-up circuit, with gate terminals in common and coupled to the gate terminal of the diode connected MOS transistor and source terminals coupled to said reference voltage.

23. The fully differential operational amplifier according to claim 21, further comprising a circuit adapted to bias said start-up circuit by means of a bias current which is a replica of a bias current of the first differential pair of transistors of the input stage.

\* \* \* \* \*